(12) United States Patent
Hashimoto

(10) Patent No.: US 11,627,685 B2
(45) Date of Patent: Apr. 11, 2023

(54) IMMERSION SYSTEM

(71) Applicant: FUJITSU LIMITED, Kawasaki (JP)

(72) Inventor: Shohei Hashimoto, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 448 days.

(21) Appl. No.: 16/884,124

(22) Filed: May 27, 2020

(65) Prior Publication Data

US 2020/0383237 A1    Dec. 3, 2020

(30) Foreign Application Priority Data

May 31, 2019  (JP) .............................. JP2019-103028

(51) Int. Cl.
  *H01L 23/44*   (2006.01)
  *H05K 7/20*   (2006.01)

(52) U.S. Cl.
  CPC ......... *H05K 7/20236* (2013.01); *H05K 7/203* (2013.01); *H05K 7/20263* (2013.01); *H05K 7/20272* (2013.01); *H05K 7/20281* (2013.01)

(58) Field of Classification Search
  CPC .......... H05K 7/20236; H05K 7/20263; H05K 7/20272; H05K 7/20281; H05K 7/203; H01L 23/44
  USPC ......................................................... 165/301
  See application file for complete search history.

(56) References Cited

U.S. PATENT DOCUMENTS

| | | | | |
|---|---|---|---|---|
| 1,348,504 | A * | 8/1920 | McDonald ........... | B65D 88/744 137/577 |
| 5,293,754 | A * | 3/1994 | Mizuno ................. | H01L 23/473 165/286 |
| 5,535,818 | A * | 7/1996 | Fujisaki .................. | F28F 27/00 165/104.32 |
| 2009/0008077 | A1* | 1/2009 | Fujii ...................... | F28D 15/00 165/104.31 |
| 2015/0233967 | A1* | 8/2015 | Thordarson ...... | G11C 29/56016 165/287 |
| 2016/0234969 | A1* | 8/2016 | Shimizu ............. | H05K 7/20281 |
| 2018/0098464 | A1* | 4/2018 | Ishinabe ............ | H05K 7/20736 |
| 2019/0014685 | A1 | 1/2019 | So et al. | |

FOREIGN PATENT DOCUMENTS

JP        2019-16764 A       1/2019

* cited by examiner

*Primary Examiner* — Frantz F Jules
*Assistant Examiner* — Jason N Thompson
(74) *Attorney, Agent, or Firm* — Fujitsu Patent Center

(57) ABSTRACT

An immersion system includes an immersion tank configured to store a coolant liquid and contain an electronic device, a heat exchanger coupled to the immersion tank through first piping, a first pump provided in the first piping and configured to circulate the coolant liquid between the immersion tank and the heat exchanger, a tank coupled to the immersion tank through second piping, a second pump provided in the second piping and configured to move the coolant liquid between the immersion tank and the tank, a level sensor provided in the immersion tank and configured to detect a liquid level in the immersion tank, and a controller configured to control the second pump in accordance with a detection signal of the level sensor.

19 Claims, 5 Drawing Sheets

IMMERSION SYSTEM

CROSS-REFERENCE TO RELATED APPLICATION

This application is based upon and claims the benefit of priority of the prior Japanese Patent Application No. 2019-103028, filed on May 31, 2019, the entire contents of which are incorporated herein by reference.

FIELD

The techniques discussed herein are related to an immersion system.

BACKGROUND

As a technique for efficiently cooling electronic devices, an immersion system is known (examples of the related art include, for example, Japanese Laid-open Patent Publication No. 2019-16764). The known immersion system includes an immersion tank, a heat exchanger, and a pump. The immersion tank stores a coolant liquid, the heat exchanger is coupled to the immersion tank through piping, and the pump circulates the coolant liquid between the immersion tank and the heat exchanger. The electronic devices are contained in the immersion tank and cooled by being immersed in the coolant liquid.

In this known immersion system, the immersion tank that includes a sealed-type first tank and an open-type second tank is used. In this immersion tank, a sensor that detects the liquid level in the second tank is provided. When the liquid level in the second tank descends, the pump operates so as to supply the coolant liquid from the first tank to the second tank.

SUMMARY

According to an aspect of the embodiments, an immersion system includes an immersion tank configured to store a coolant liquid and contain an electronic device, a heat exchanger coupled to the immersion tank through first piping, a first pump provided in the first piping and configured to circulate the coolant liquid between the immersion tank and the heat exchanger, a tank coupled to the immersion tank through second piping, a second pump provided in the second piping and configured to move the coolant liquid between the immersion tank and the tank, a level sensor provided in the immersion tank and configured to detect a liquid level in the immersion tank, and a controller configured to control the second pump in accordance with a detection signal of the level sensor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The volume of the coolant liquid varies in accordance with the temperature. For example, as the temperature of the coolant liquid increases, the volume of the coolant liquid increases (expansion), and as the temperature of the coolant liquid reduces, the volume of the coolant liquid reduces (contraction). Thus, in a state in which the electronic devices are operating, the temperature of the coolant liquid increases due to heat generated by the electronic devices, and accordingly, the volume of the coolant liquid increases. In contrast, in a state in which the electronic devices stop, the temperature of the coolant liquid reduces, and accordingly, the volume of the coolant liquid reduces. For example, such a coolant liquid has a greater expansion coefficient than the expansion coefficient of water.

However, in the known immersion system, the increase or reduction of the volume of the coolant liquid is not considered. Thus, when the volume of the coolant liquid increases, the coolant liquid may overflow and spill from the immersion tank through an open port of the second tank. In contrast, when the volume of the coolant liquid reduces, and accordingly, the liquid level in the first tank descends, the cooling performance for the electronic devices is not necessarily ensured.

Hereinafter, embodiments of a technique that may suppress overflowing of a coolant liquid and spilling of a coolant liquid from an immersion tank and that may ensure cooling performance for an electronic device will be described with reference to the drawings.

First Embodiment

Figure 1:
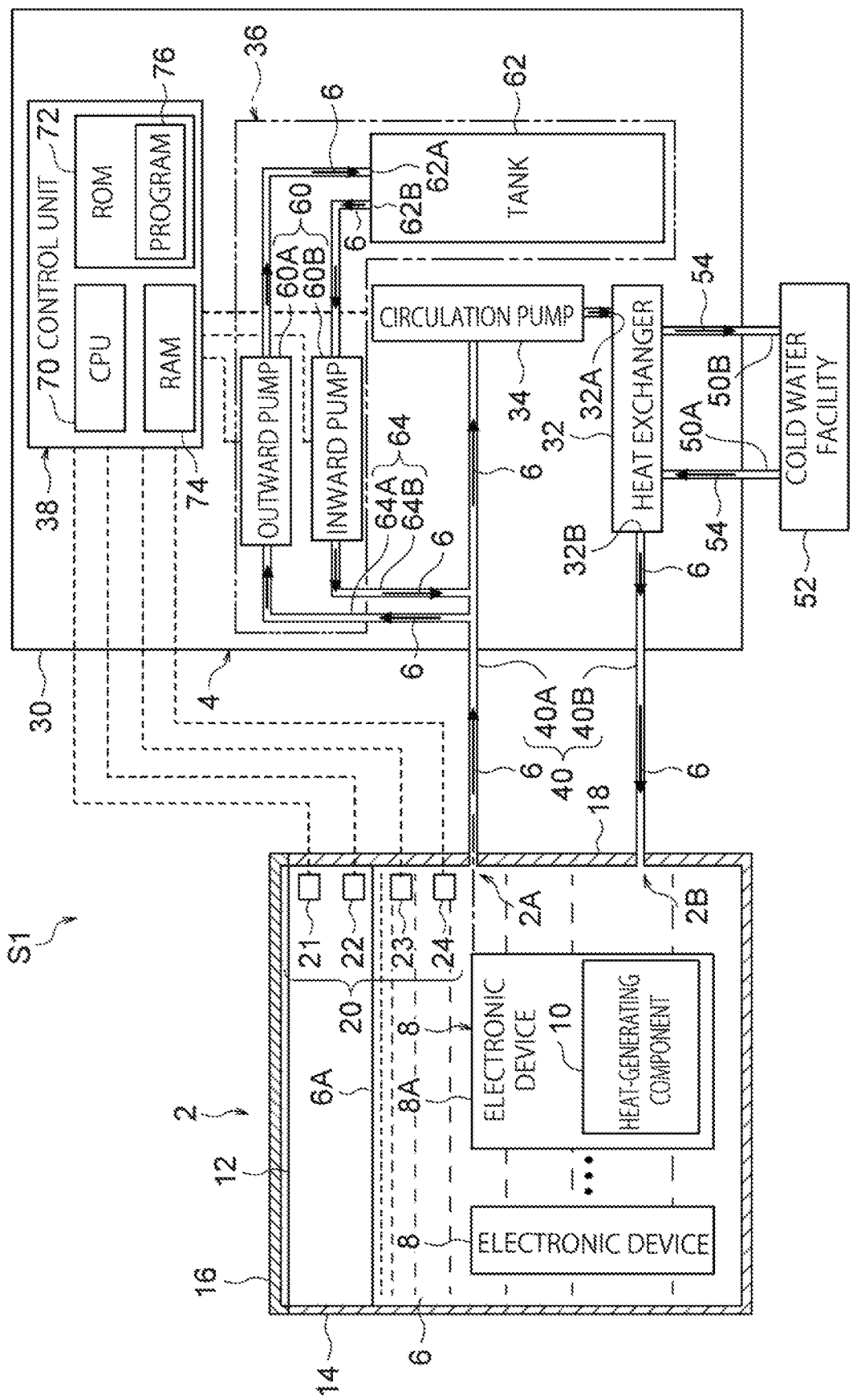
FIG. 1 is a block diagram illustrating a configuration of an immersion system according to a first embodiment.

As illustrated in FIG. 1, an immersion system S1 according to a first embodiment includes an immersion tank 2 and a heat exchanger unit 4. A coolant liquid 6 is stored in the immersion tank 2. For example, a fluorine-based inert liquid as a liquid having insulating properties and a high cooling efficiency is used for the coolant liquid 6. The expansion coefficient of the coolant liquid 6 is about six to eight times greater than the expansion coefficient of water.

A single or a plurality of electronic devices 8 are contained in the immersion tank 2. FIG. 1 illustrates a state in which the plurality of electronic devices 8 are contained in the immersion tank 2. The electronic devices 8 are, for example, information and communications technology (ICT) devices. A heat-generating component 10 such as a central processing unit (CPU) is mounted in each electronic device 8. The heat-generating component 10 is disposed at a position lower than the position of an upper end 8A of the electronic device 8. The entirety of the electronic device 8 including the heat-generating component 10 is cooled by being immersed in the coolant liquid 6.

For example, the immersion tank 2 includes a container-shaped tank main body 14 having an opening 12 at an upper end of the tank main body 14 and a lid 16 that closes the opening 12. A discharge port 2A and a supply port 2B are formed in a side wall 18 of the tank main body 14. The discharge port 2A is coupled to a first outward pipe 40A. The supply port 2B is coupled to a first inward pipe 40B. The first outward pipe 40A and the first inward pipe 40B will be described later. The discharge port 2A is formed at a position higher than the position of the supply port 2B. For example, the discharge port 2A is formed at the same level as the level of the position of the upper end 8A of the electronic device 8.

A sensor unit 20 that detects a liquid level 6A in the immersion tank 2 is provided in the tank main body 14. The sensor unit 20 is an example of a "level sensor". The sensor unit 20 include a first sensor 21, a second sensor 22, a third sensor 23, and a fourth sensor 24. The first sensor 21, the second sensor 22, the third sensor 23 and the fourth sensor 24 are provided inside the immersion tank 2 so as to be sequentially arranged from the upper side in the height direction of the tank main body 14. The first sensor 21, the second sensor 22, the third sensor 23, and the fourth sensor 24 employ respective liquid detection sensors. Each liquid detection sensor outputs a coolant liquid detection signal when the liquid detection sensor is immersed in the coolant liquid 6 and does not output a coolant liquid detection signal when the liquid detection sensor is not immersed in the coolant liquid 6.

The first sensor 21 is to detect that the liquid level 6A in the immersion tank 2 is reaching the opening 12. The first sensor 21 is disposed immediately below the opening 12. In contrast, the fourth sensor 24 is to detect that the liquid level 6A in the immersion tank 2 becomes lower than the level of the discharge port 2A or the level of the upper end 8A of the electronic device 8. The fourth sensor 24 is disposed immediately above the discharge port 2A and the upper end 8A of the electronic device 8. The second sensor 22 and the third sensor 23 are used for control by which, as will be described later, the liquid level 6A in the immersion tank 2 is maintained between the levels of the second sensor 22 and the third sensor 23.

The heat exchanger unit 4 includes a housing 30, a heat exchanger 32, a circulation pump 34, a liquid level adjustment unit 36, and a control unit 38. The circulation pump 34 is an example of a "first pump". The heat exchanger 32, the circulation pump 34, the liquid level adjustment unit 36, and the control unit 38 are housed in the housing 30.

The heat exchanger 32 is coupled to the immersion tank 2 through first piping 40. For example, the first piping 40 includes the first outward pipe 40A and the first inward pipe 40B. An inlet 32A of the heat exchanger 32 and the discharge port 2A the immersion tank 2 are coupled to each other through the first outward pipe 40A, and an outlet 32B of the heat exchanger 32 and the supply port 28 of the immersion tank 2 are coupled to each other through the first inward pipe 408. The first outward pipe 40A includes a portion through which the circulation pump 34 and the immersion tank 2 are coupled to each other and a portion through which the circulation pump 34 and the heat exchanger 32 are coupled to each other.

The circulation pump 34 is provided, for example, in the first outward pipe 40A. When the circulation pump 34 operates, the coolant liquid 6 circulates between the immersion tank 2 and the heat exchanger 32. For example, the coolant liquid 6 flows from the immersion tank 2 to the heat exchanger 32 through the first outward pipe 40A and from the heat exchanger 32 to the immersion tank 2 through the first inward pipe 40B.

The heat exchanger 32 is coupled to a cold water facility 52 through a pair of pipes 50A and 50B. Cold water 54 circulates between the heat exchanger 32 and the cold water facility 52. The path through which the cold water 54 circulates is provided separately from the path through which the coolant liquid 6 circulates between the immersion tank 2 and the heat exchanger 32. The coolant liquid 6 is cooled when heat is exchanged between the coolant liquid 6 and the cold water 54 in the heat exchanger 32.

The liquid level adjustment unit 36 includes a transfer pump unit 60 and a tank 62. The tank 62 is coupled to the immersion tank 2 through second piping 64. For example, the second piping 64 includes a second outward pipe 64A and a second inward pipe 64B. An intermediate portion of the first outward pipe 40A between the immersion tank 2 and the circulation pump 34 and an inlet 62A of the tank 62 are coupled to each other through the second outward pipe 64A. An outlet 62B of the tank 62 and an intermediate portion of the first outward pipe 40A between the immersion tank 2 and the circulation pump 34 are coupled to each other through the second inward pipe 648.

The second outward pipe 64A has a portion through which an outward pump 60A and the first outward pipe 40A are coupled to each other and a portion through which the outward pump 60A and the tank 62 are coupled to each other. The second inward pipe 648 has a portion through which an inward pump 60B and the first outward pipe 40A are coupled to each other and a portion through which the inward pump 60B and the tank 62 are coupled to each other.

The transfer pump unit 60 is an example of "second pump" and include the outward pump 60A and the inward pump 60B. The outward pump 60A is provided in the second outward pipe 64A, and the inward pump 60B is provided in the second inward pipe 648. The outward pump 60A and the inward pump 60B may be integrated or separated.

When the outward pump 60A or the inward pump 608 operate, the coolant liquid 6 is moved between the immersion tank 2 and the tank 62. For example, when the outward pump 60A operates, the coolant liquid 6 is moved from the immersion tank 2 to the tank 62 through the first outward pipe 40A and the second outward pipe 64A. When the inward pump 60B operates, the coolant liquid 6 is moved from the tank 62 to the immersion tank 2 through the second inward pipe 64, the first outward pipe 40A, the circulation pump 34, the heat exchanger 32, and the first inward pipe 40B.

The control unit 38 is electrically coupled to the first sensor 21, the second sensor 22, the third sensor 23, the fourth sensor 24, the circulation pump 34, the outward pump 60A, and the inward pump 60B that have been described above. The control unit 38 is an electric circuit that includes a central processing unit (CPU) 70, a read-only memory (ROM) 72, and a random-access memory (RAM) 74. A program 76 is stored in the ROM 72. The CPU 70 is a central arithmetic processing unit (computer). The CPU 70 reads the program 76 stored in the ROM 72 to execute the program 76 or loads the program 76 into the RAM 74 to execute the program 76.

The control unit 38 has a function of controlling the outward pump 60A and the inward pump 60B in accordance with detection signals of the first sensor 21, the second sensor 22, the third sensor 23, and the fourth sensor 24. For example, the control unit 38 controls the outward pump 60A and the inward pump 608 in accordance with the detection signals of the first sensor 21, the second sensor 22, the third sensor 23, and the fourth sensor 24 such that the liquid level 6A in the immersion tank 2 is maintained between the levels of the second sensor 22 and the third sensor 23. Operations of the control unit 38 will be described in detail below.

Next, operations of the immersion system S1 according to the first embodiment are described.

For example, when the temperature of the coolant liquid 6 increases due to heat generation by the electronic device 8 or abnormality of the heat exchanger 32, the volume of the coolant liquid 6 increases and the liquid level 6A in the immersion tank 2 ascends. In contrast, for example, when the temperature of the coolant liquid 6 reduces due to stopping of the electronic device 8 or abnormality of the heat exchanger 32, the volume of the coolant liquid 6 reduces and the liquid level 6A in the immersion tank 2 descends.

The control unit 38 performs control such that the liquid level 6A in the immersion tank 2 is maintained between the levels of the second sensor 22 and the third sensor 23 even when the volume of the coolant liquid 6 increases or reduces. Exemplary operations of the control unit 38 are described below. The following operations are described on the assumption that the second sensor 22 is disposed at a position lower than the position of the opening 12 and the third sensor 23 is disposed at a position higher than the position of the electronic device 8.

Figure 2:
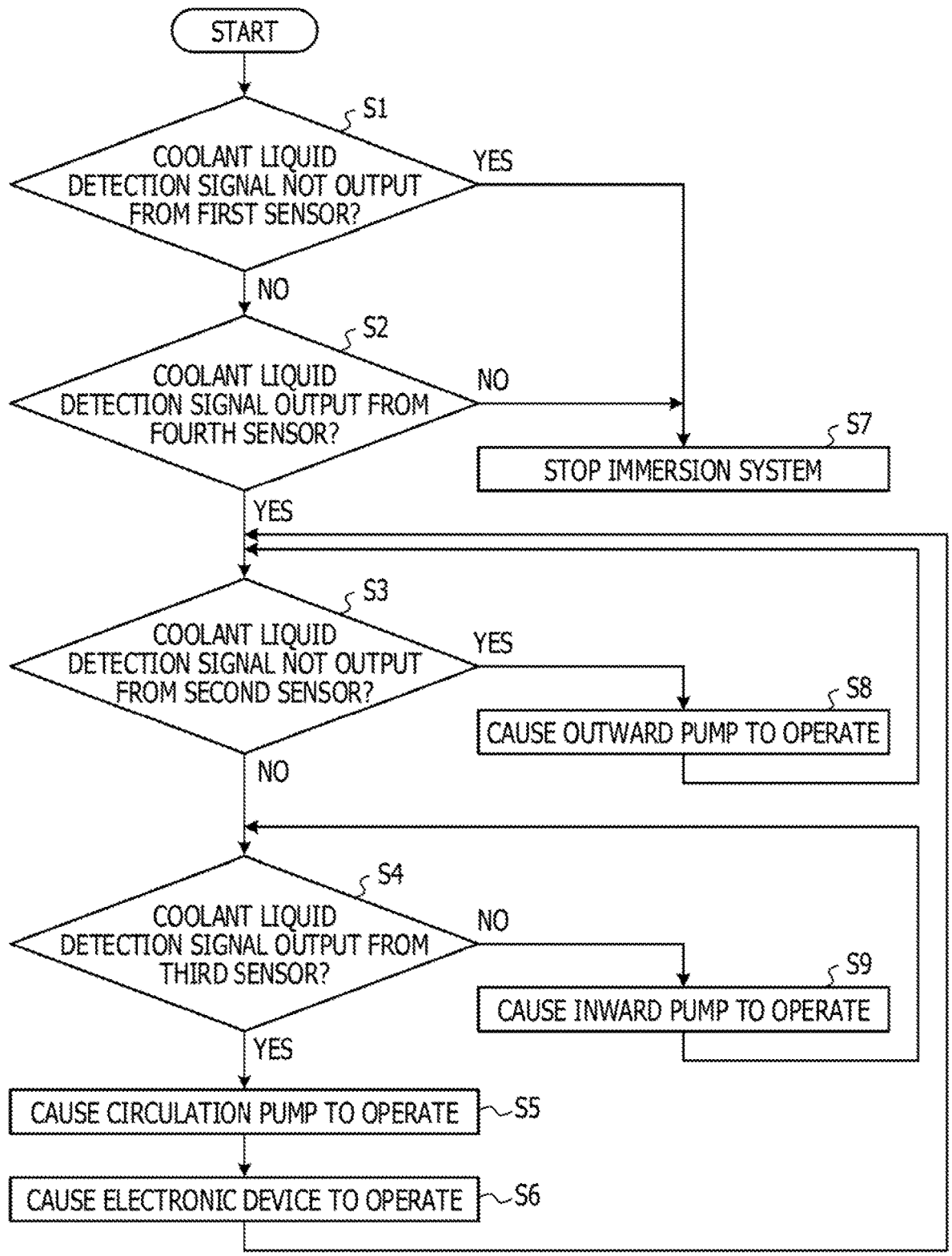
FIG. 2 is a flowchart illustrating a flow of operations of a control unit illustrated in FIG. 1.

When the power of the immersion system S1 is turned on, the control unit 38 executes operations S1 to S9 illustrated in the flowchart of FIG. 2.

In operation S1, the control unit 38 determines whether the coolant liquid detection signal is not output from the first sensor 21.

When the liquid level 6A in the immersion tank 2 is higher than the level of the first sensor 21, the coolant liquid detection signal is output from the first sensor 21. Thus, the control unit 38 proceeds to operation S7. When the liquid level 6A in the immersion tank 2 is higher than the level of the first sensor 21, the liquid level 6A in the immersion tank 2 may reach the opening 12 of the tank main body 14, and accordingly, the coolant liquid 6 may overflow and spill through the opening 12. Thus, the control unit 38 stops the immersion system S1 in operation S7.

In contrast, when the liquid level 6A in the immersion tank 2 is lower than the level of the first sensor 21, the coolant liquid detection signal is not output from the first sensor 21. Thus, the control unit 38 proceeds to operation S2.

In operation S2, the control unit 38 determines whether the coolant liquid detection signal is output from the fourth sensor 24.

When the liquid level 6A in the immersion tank 2 is lower than the level of the fourth sensor 24, the coolant liquid detection signal is not output from the fourth sensor 24. Thus, the control unit 38 proceeds to operation S7. When the liquid level 6A in the immersion tank 2 is lower than the level of the fourth sensor 24, the liquid level 6A in the immersion tank 2 may become lower than the level of the discharge port 2A so as to expose the discharge port 2A. Accordingly, the coolant liquid 6 does not necessarily circulate between the immersion tank 2 and the heat exchanger 32. Furthermore, when the liquid level 6A in the immersion tank 2 is lower than the level of the fourth sensor 24, the liquid level 6A in the immersion tank 2 may become lower than the upper end 8A of the electronic device 8 so as to expose an upper portion of the electronic device 8. Accordingly, the cooling performance for the electronic device 8 may become insufficient. Thus, in operation S7, the control unit 38 stops the immersion system S1.

In contrast, when the liquid level 6A in the immersion tank 2 is higher than the level of the fourth sensor 24, the coolant liquid detection signal is output from the fourth sensor 24. Thus, the control unit 38 proceeds to operation S3.

In operation S3, the control unit 38 determines whether the coolant liquid detection signal is not output from the second sensor 22.

When the liquid level 6A in the immersion tank 2 is higher than the level of the second sensor 22, the coolant liquid detection signal is output from the second sensor 22. Thus, the control unit 38 proceeds to operation S8. In operation S8, the control unit 38 causes the outward pump 60A to operate. When the outward pump 60A operates, the coolant liquid 6 is moved from the immersion tank 2 to the tank 62, and accordingly, the liquid level 6A in the immersion tank 2 descends.

The control unit 38 returns to operation S3 after a predetermined time has elapsed. When operation S3 and operation S8 are repeatedly executed as described above, the liquid level 6A in the immersion tank 2 becomes lower than the level of the second sensor 22 after a while. The control unit 38 stops the outward pump 60A at the time when the liquid level 6A in the immersion tank 2 becomes lower than the level of the second sensor 22 or after a predetermined time has elapsed.

In contrast, when the liquid level 6A in the immersion tank 2 is lower than the level of the second sensor 22, the coolant liquid detection signal is not output from the second sensor 22. Thus, the control unit 38 proceeds to operation S4.

In operation S4, the control unit 38 determines whether the coolant liquid detection signal is output from the third sensor 23.

When the liquid level 6A in the immersion tank 2 is lower than the level of the third sensor 23, the coolant liquid detection signal is not output from the third sensor 23. Thus, the control unit 38 proceeds to operation S9. In operation S9, the control unit 38 causes the inward pump 608 to operate. When the inward pump 608 operates, the coolant liquid 6 is moved from the tank 62 to the immersion tank 2, and accordingly, the liquid level 6A in the immersion tank 2 ascends.

The control unit 38 returns to operation S4 after a predetermined time has elapsed. When operation S4 and operation S9 are repeatedly executed as described above, the liquid level 6A in the immersion tank 2 becomes higher than the level of the third sensor 23 after a while. The control unit 38 stops the inward pump 608 at the time when the liquid level 6A in the immersion tank 2 becomes higher than the level of the third sensor 23 or after a predetermined time has elapsed.

In contrast, when the liquid level 6A in the immersion tank 2 is higher than the level of the third sensor 23, the coolant liquid detection signal is output from the third sensor 23. Thus, the control unit 38 proceeds to operation S5.

In operation S5, the control unit 38 causes the circulation pump 34 to operate. When the circulation pump 34 operates, the coolant liquid 6 circulates between the immersion tank 2 and the heat exchanger 32. The control unit 38 proceeds to operation S6.

In operation S6, the control unit 38 causes the electronic device 8 to operate. When the electronic device 8 operates, the heat-generating component 10 mounted in the electronic device 8 generates heat, thereby increasing the temperature of the coolant liquid 6 in the immersion tank 2. The control unit 38 having caused the electronic device 8 to operate returns to operation S3 after a predetermined time has elapsed.

Until the power of the immersion system S1 is turned off, the control unit 38 repeatedly executes operations S3 to S6.

At this time, when the volume of the coolant liquid 6 increases and the liquid level 6A in the immersion tank 2 becomes higher than the level of the second sensor 22, the control unit 38 proceeds to operation S8 to cause the outward pump 60A to operate. As a result, the coolant liquid 6 is moved from the immersion tank 2 to the tank 62, and accordingly, the liquid level 6A in the immersion tank 2 descends. In contrast, when the volume of the coolant liquid 6 reduces and the liquid level 6A in the immersion tank 2 becomes lower than the level of the third sensor 23, the control unit 38 proceeds to operation S9 to cause the inward pump 60B to operate. As a result, the coolant liquid 6 is moved from the tank 62 to the immersion tank 2, and accordingly, the liquid level 6A in the immersion tank 2 ascends. Thus, even when the volume of the coolant liquid 6 increases or reduces, the liquid level 6A in the immersion tank 2 is adjusted such that the liquid level 6A in the immersion tank 2 is maintained between the levels of the second sensor 22 and the third sensor 23.

Next, the operations and effects according to the first embodiment are described.

As described in detail above, in the immersion system S1 according to the first embodiment, the immersion tank 2 and the tank 62 are coupled to each other through the second outward pipe 64A and the second inward pipe 64B. When the liquid level 6A in the immersion tank 2 is higher than the level of the second sensor 22, the outward pump 60A provided in the second outward pipe 64A operates to move the coolant liquid 6 from the immersion tank 2 to the tank 62. In contrast, when the liquid level 6A in the immersion tank 2 is lower than the level of the third sensor 23, the inward pump 60B provided in the second inward pipe 648 operates to move the coolant liquid 6 from the tank 62 to the immersion tank 2.

Thus, even when the volume of the coolant liquid 6 increases or reduces, the liquid level 6A in the immersion tank 2 is adjusted such that the liquid level 6A in the immersion tank 2 is maintained between the levels of the second sensor 22 and the third sensor 23. Accordingly, the liquid level 6A in the immersion tank 2 may be maintained at a position lower than the position of the opening 12 and higher than the position of the electronic device 8. Thus, the likelihood of the liquid level 6A in the immersion tank 2 reaching the opening 12 may be reduced, and accordingly, overflowing of the coolant liquid 6 and spilling of the coolant liquid 6 through the opening 12 may be suppressed. Furthermore, the likelihood of the liquid level 6A in the immersion tank 2 descending to a level lower than the level of the upper end 8A of the electronic device 8 may be reduced, and accordingly, the cooling performance for the electronic device 8 may be ensured.

For example, the discharge port 2A is formed at the same level as the level of the position of the upper end BA of the electronic device 8. Accordingly, the likelihood of the liquid level 6A in the immersion tank 2 descending to a level lower than the level of the discharge port 2A may be reduced. This may ensure the circulation of the coolant liquid 6 between the Immersion tank 2 and the heat exchanger 32. Thus, also with this structure, the cooling performance for the electronic device 8 may be ensured.

As described above, the likelihood of the liquid level 6A in the immersion tank 2 reaching the opening 12 may be reduced. Thus, the height of the tank main body 14 is not necessarily increased. Thus, the size and weight of the immersion tank 2 may be reduced.

The second inward pipe 64B coupled to the outlet 62B of the tank 62 is coupled to the first outward pipe 40A. Thus, when the coolant liquid 6 is moved from the tank 62 to the immersion tank 2, the coolant liquid 6 passes through the heat exchanger 32. This allows the coolant liquid 6 to be cooled by the heat exchanger 32. Accordingly, when the coolant liquid 6 is moved from the tank 62 to the immersion tank 2, the temperature of the coolant liquid 6 in the immersion tank 2 may be reduced compared to the case where the coolant liquid 6 does not pass through the heat exchanger 32. Accordingly, the cooling performance for the electronic device 8 may be improved.

Next, modifications of the first embodiment are described.

According to the above-described first embodiment, the second piping 64 includes the second outward pipe 64A and the second inward pipe 64B, and the transfer pump unit 60 includes the outward pump 60A and the inward pump 60B. However, the tank 62 and the immersion tank 2 may be coupled to each other through the second piping 64 including a single pipe, and a bidirectional pump that is able to bidirectionally transfer the coolant liquid 6 between the tank 62 and the immersion tank 2 through the second piping 64 may be used as the transfer pump unit 60.

According to the above-described first embodiment, the sensor unit includes a plurality of detectors, for example, the first sensor 21, the second sensor 22, the third sensor 23, and the fourth sensor 24 that detect the changes in the liquid level 6A in the immersion tank 2. However, for example, a sensor unit 20 that is able to detect the changes in the liquid level 6A in the immersion tank 2 with a single detector may be used as the sensor unit 20.

According to the above-described first embodiment, the liquid level adjustment unit 36 is preferably disposed inside the housing 30 of the heat exchanger unit 4. However, the liquid level adjustment unit 36 may be disposed outside the housing 30 as long as the second inward pipe 64B is coupled to the first outward pipe 40A.

Although the discharge port 2A as the example is formed at the same level as the level of the position of the upper end 8A of the electronic device 8 according to the above-described first embodiment, the discharge port 2A may be formed at a position higher than the position of the upper end 8A of the electronic device 8.

According to the above-described first embodiment, the operations of the control unit 38 are executed by the CPU 70. However, the above-described operations of the control unit 38 may be executed by a programmable logic device (PLD), a circuit configuration of which is changeable after the manufacture, such as, for example, a field-programmable gate array (FPGA). Alternatively, the above-described operations of the control unit 38 may be executed by a dedicated electric circuit dedicatedly designed for particular processing, such as, for example, an application-specific integrated circuit (ASIC).

Second Embodiment

Next, a second embodiment of the technique disclosed herein is described.

Figure 3:
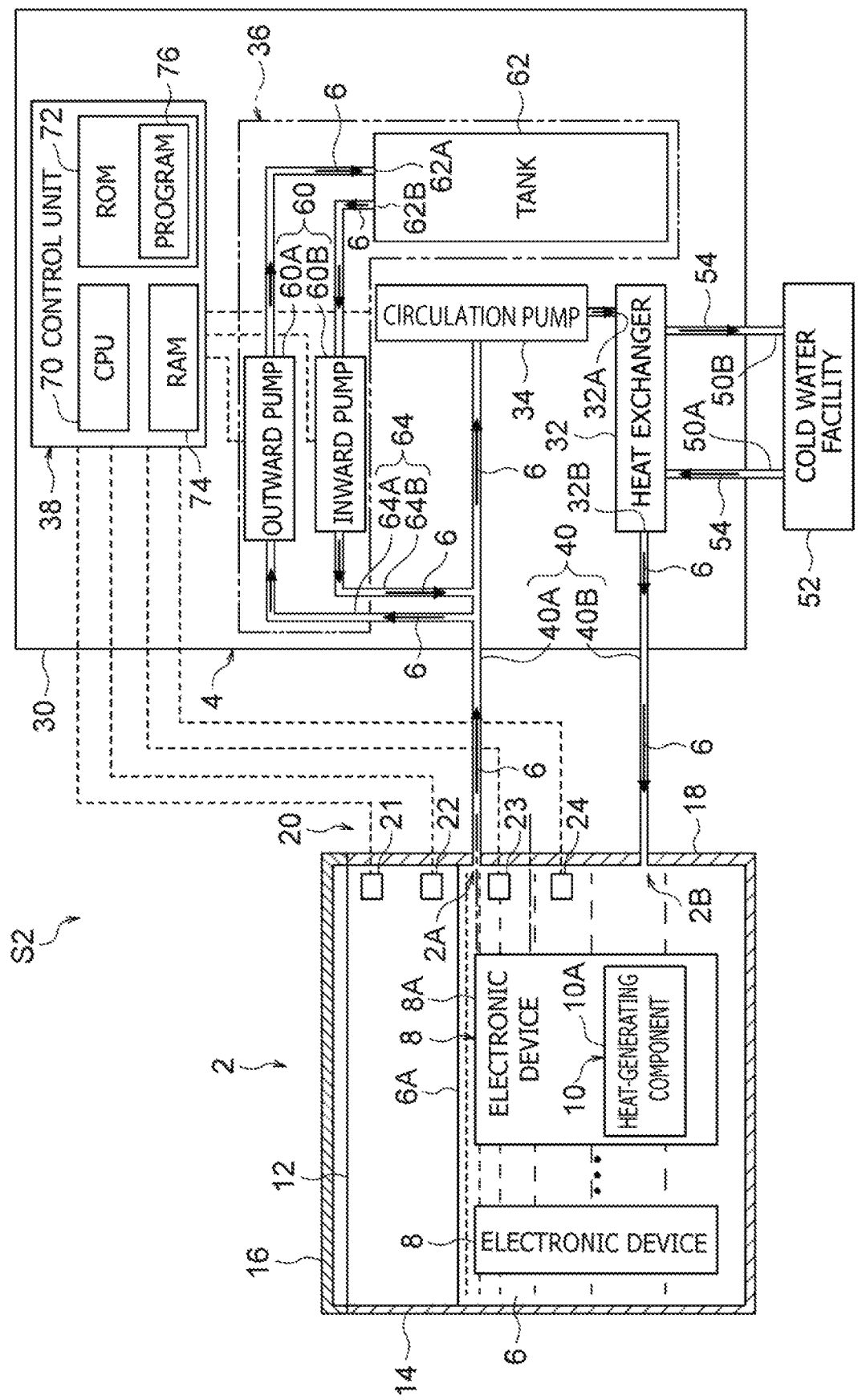
FIG. 3 is a block diagram illustrating a configuration of an immersion system according to a second embodiment.

A configuration of an immersion system S2 according to the second embodiment illustrated in FIG. 3 is changed from the configuration of the immersion system S1 according to the above-described first embodiment as follows. For example, in the immersion system S2 according to the second embodiment, the third sensor 23 is disposed at a position lower than the position of the upper end 8A of the electronic device 8 and higher than the position of the heat-generating component 10. The third sensor 23 and the fourth sensor 24 are, for example, disposed at a position lower than the position of the discharge port 2A. Furthermore, the fourth sensor 24 is disposed at a position lower than the position of the heat-generating component 10.

Also, in the immersion system S2 according to the second embodiment, the program 76 of the control unit 38 is changed, thereby the operations of the control unit 38 are different from the operations according to the first embodiment. In the immersion system S2 according to the second embodiment, the configuration is similar to the configuration of the above-described first embodiment except for the changes in the arrangement of the third and fourth sensors 23, 24 and the program 76 of the control unit 38.

Next, operations of the immersion system S2 according to the second embodiment are described.

The control unit 38 performs control such that the liquid level 6A in the immersion tank 2 is maintained between the levels of the second sensor 22 and the third sensor 23 even when the volume of the coolant liquid 6 increases or reduces. Exemplary operations of the control unit 38 are described below. The following operations are described on the assumption that the second sensor 22 is disposed at a position lower than the position of the opening 12 and the third sensor 23 is disposed at a position lower than the position of the upper end 8A of the electronic device 8 and higher than the position of the heat-generating component 10.

Figure 4:
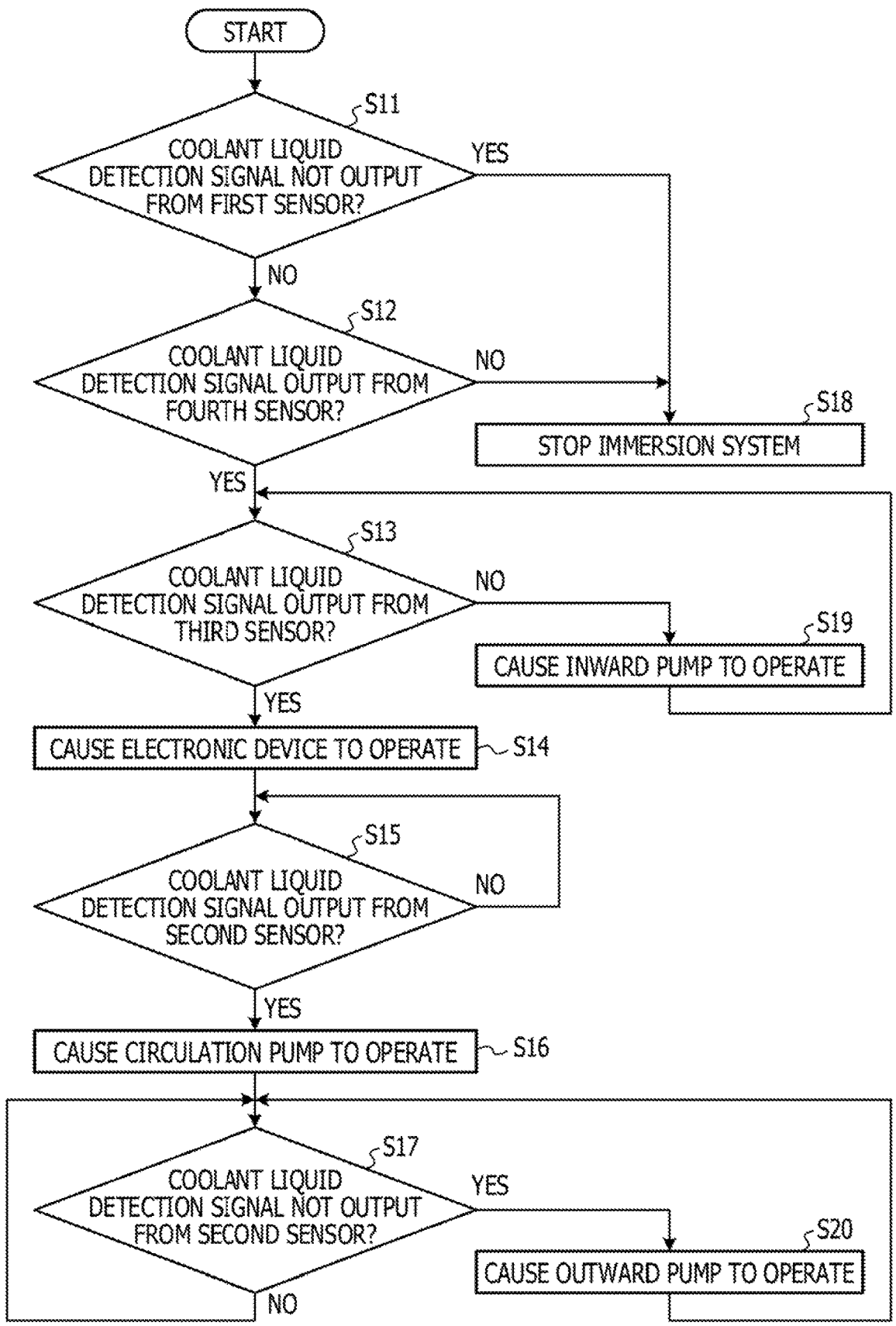
FIG. 4 is a flowchart illustrating a flow of operations of a control unit illustrated in FIG. 3.

When the power of the immersion system S2 is turned on, the control unit 38 executes operations S11 to S20 illustrated in the flowchart of FIG. 4.

In operation S11, the control unit 38 determines whether the coolant liquid detection signal is not output from the first sensor 21.

When the liquid level 6A in the immersion tank 2 is higher than the level of the first sensor 21, the coolant liquid detection signal is output from the first sensor 21. Thus, the control unit 38 proceeds to operation S18. When the liquid level 6A in the immersion tank 2 is higher than the level of the first sensor 21, the liquid level 6A in the immersion tank 2 may reach the opening 12 of the tank main body 14, and accordingly, the coolant liquid 6 may overflow and spill through the opening 12. Thus, the control unit 38 stops the immersion system S2 in operation S18.

In contrast, when the liquid level 6A in the immersion tank 2 is lower than the level of the first sensor 21, the coolant liquid detection signal is not output from the first sensor 21. Thus, the control unit 38 proceeds to operation S12.

In operation S12, the control unit 38 determines whether the coolant liquid detection signal is output from the fourth sensor 24.

When the liquid level 6A in the immersion tank 2 is lower than the level of the fourth sensor 24, the coolant liquid detection signal is not output from the fourth sensor 24. Thus, the control unit 38 proceeds to operation S18. When the liquid level 6A in the immersion tank 2 is lower than the level of the fourth sensor 24, the liquid level 6A in the immersion tank 2 may become lower than an upper end 10A of the heat-generating component 10 so as to expose an upper portion of the heat-generating component 10. Accordingly, the cooling performance may become insufficient for the heat-generating component 10, and further, for the electronic device 8. Thus, in operation S18, the control unit 38 stops the immersion system S2.

In contrast, when the liquid level 6A in the immersion tank 2 is higher than the level of the fourth sensor 24, the coolant liquid detection signal is output from the fourth sensor 24. Thus, the control unit 38 proceeds to operation S13.

In operation S13, the control unit 38 determines whether the coolant liquid detection signal is output from the third sensor 23.

When the liquid level 6A in the immersion tank 2 is lower than the level of the third sensor 23, the coolant liquid detection signal is not output from the third sensor 23. Thus, the control unit 38 proceeds to operation S19. In operation S19, the control unit 38 causes the inward pump 60B to operate. When the inward pump 60B operates, the coolant liquid 6 is moved from the tank 62 to the immersion tank 2, and accordingly, the liquid level 6A in the immersion tank 2 ascends.

The control unit 38 returns to operation S13 after a predetermined time has elapsed. When operation S13 and operation S19 are repeatedly executed as described above, the liquid level 6A in the immersion tank 2 becomes higher than the level of the third sensor 23 after a while. The control unit 38 stops the inward pump 60B at the time when the liquid level 6A in the immersion tank 2 becomes higher than the level of the third sensor 23 or after a predetermined time has elapsed.

In contrast, when the liquid level 6A in the immersion tank 2 is higher than the level of the third sensor 23, the coolant liquid detection signal is output from the third sensor 23. Thus, the control unit 38 proceeds to operation S14.

In operation S14, the control unit 38 causes the electronic device 8 to operate. When the electronic device 8 operates, the heat-generating component 10 generates heat, thereby increasing the temperature of the coolant liquid 6 in the immersion tank 2. In this stage, the circulation pump 34 does not operate, and the circulation of the coolant liquid 6 is not started between the immersion tank 2 and the heat exchanger 32. However, since the heat-generating component 10 is immersed in the coolant liquid 6 and the coolant liquid 6 itself has heat capacity, the cooling of the electronic device 8 is ensured. The control unit 38 having caused the electronic device 8 to operate proceeds to operation S15.

In operation S15, the control unit 38 determines whether the coolant liquid detection signal is output from the second sensor 22.

When the liquid level 6A in the immersion tank 2 is lower than the level of the second sensor 22, the coolant liquid detection signal is not output from the second sensor 22. The control unit 38 repeatedly executes operation S15 until the coolant liquid detection signal is output from the second sensor 22.

At this time, although the liquid level 6A in the immersion tank 2 is maintained between the levels of the second sensor 22 and the third sensor 23, the electronic device 8 operates, and accordingly, the heat-generating component 10 generates heat. Thus, the temperature of the coolant liquid 6 increases, and the liquid level 6A in the immersion tank 2 ascends due to an increase in the volume of the coolant liquid 6. When the liquid level 6A in the immersion tank 2 becomes higher than the level of the second sensor 22, the coolant liquid detection signal is output from the second sensor 22. When the coolant liquid detection signal is output from the second sensor 22, the control unit 38 proceeds to operation S16.

In operation S16, the control unit 38 causes the circulation pump 34 to operate. When the circulation pump 34 operates, the coolant liquid 6 circulates between the immersion tank 2 and the heat exchanger 32. At this time, since the coolant liquid 6 is cooled by the heat exchanger 32, the temperature of the coolant liquid 6 in the immersion tank 2 reduces. Thus, the liquid level 6A in the immersion tank 2 descends. The control unit 38 proceeds to operation S17 after a predetermined time has elapsed.

In operation S17, the control unit 38 determines whether the coolant liquid detection signal is not output from the second sensor 22.

When the liquid level 6A in the immersion tank 2 is higher than the level of the second sensor 22, the coolant liquid detection signal is output from the second sensor 22. Thus, the control unit 38 proceeds to operation S20. In operation S20, the control unit 38 causes the outward pump 60A to operate. When the outward pump 60A operates, the coolant liquid 6 is moved from the immersion tank 2 to the tank 62, and accordingly, the liquid level 6A in the immersion tank 2 descends.

The control unit 38 returns to operation S17 after a predetermined time has elapsed. When operation S17 and operation S20 are repeatedly executed as described above, the liquid level 6A in the immersion tank 2 becomes lower than the level of the second sensor 22 after a while. The control unit 38 stops the outward pump 60A at the time when the liquid level 6A in the immersion tank 2 becomes lower than the level of the second sensor 22 or after a predetermined time has elapsed.

In contrast, when the liquid level 6A in the immersion tank 2 is lower than the level of the second sensor 22, the coolant liquid detection signal is not output from the second sensor 22. Until the power of the immersion system S2 is turned off, the control unit 38 repeatedly executes operation S17.

At this time, when the volume of the coolant liquid 6 increases and the liquid level 6A in the immersion tank 2 becomes higher than the level of the second sensor 22, the control unit 38 proceeds to operation S20 to cause the outward pump 60A to operate. As a result, the coolant liquid 6 is moved from the immersion tank 2 to the tank 62, and accordingly, the liquid level 6A in the immersion tank 2 descends. According to the second embodiment, it has already been recognized that the liquid level 6A in the immersion tank 2 is higher than the level of the third sensor 23 in operation S13 that is a stage before the electronic device 8 operates. Accordingly, when operation S17 is repeatedly executed after the electronic device 8 has been caused to operate so that the liquid level 6A in the immersion tank 2 does not become higher than the level of the second sensor 22, the liquid level 6A in the immersion tank 2 is maintained between the levels of the second sensor 22 and the third sensor 23.

Next, the operations and effects according to the second embodiment are described.

As described in detail above, also in the immersion system S2 according to the second embodiment, when the liquid level 6A in the immersion tank 2 is higher than the level of the second sensor 22, the outward pump 60A provided in the second outward pipe 64A operates to move the coolant liquid 6 from the immersion tank 2 to the tank 62. In contrast, when the liquid level 6A in the immersion tank 2 is lower than the level of the third sensor 23, the inward pump 60B provided in the second inward pipe 64B operates to move the coolant liquid 6 from the tank 62 to the immersion tank 2.

Thus, even when the volume of the coolant liquid 6 increases or reduces, the liquid level 6A in the immersion tank 2 is adjusted such that the liquid level 6A in the immersion tank 2 is maintained between the levels of the second sensor 22 and the third sensor 23. Accordingly, the liquid level 6A in the immersion tank 2 may be maintained at a position lower than the position of the opening 12 and higher than the position of the heat-generating component 10. Thus, the likelihood of the liquid level 6A in the immersion tank 2 reaching the opening 12 may be reduced, and accordingly, overflowing of the coolant liquid 6 and spilling of the coolant liquid 6 through the opening 12 may be suppressed. Furthermore, the likelihood of the liquid level 6A in the immersion tank 2 descending to a level lower than the level of the upper end 10A of the heat-generating component 10 may be reduced, and accordingly, the cooling performance may be ensured for the heat-generating component 10, and further, for the electronic device 8.

As described above, the likelihood of the liquid level 6A in the immersion tank 2 reaching the opening 12 may be reduced. Thus, the height of the tank main body 14 is not necessarily increased. Thus, the size and weight of the immersion tank 2 may be reduced.

In the immersion system S2 according to the second embodiment, parts of the configuration similar to parts of the configuration according to the first embodiment perform similar operations and produce similar effects to the operations and effects of the first embodiment. Also in the immersion system S2 according to the second embodiment, modifications similar to the modifications of the first embodiment are able to be employed for the parts of the configuration similar to the parts of the configuration of the first embodiment.

Third Embodiment

Next, a third embodiment of the technique disclosed herein is described.

Figure 5:
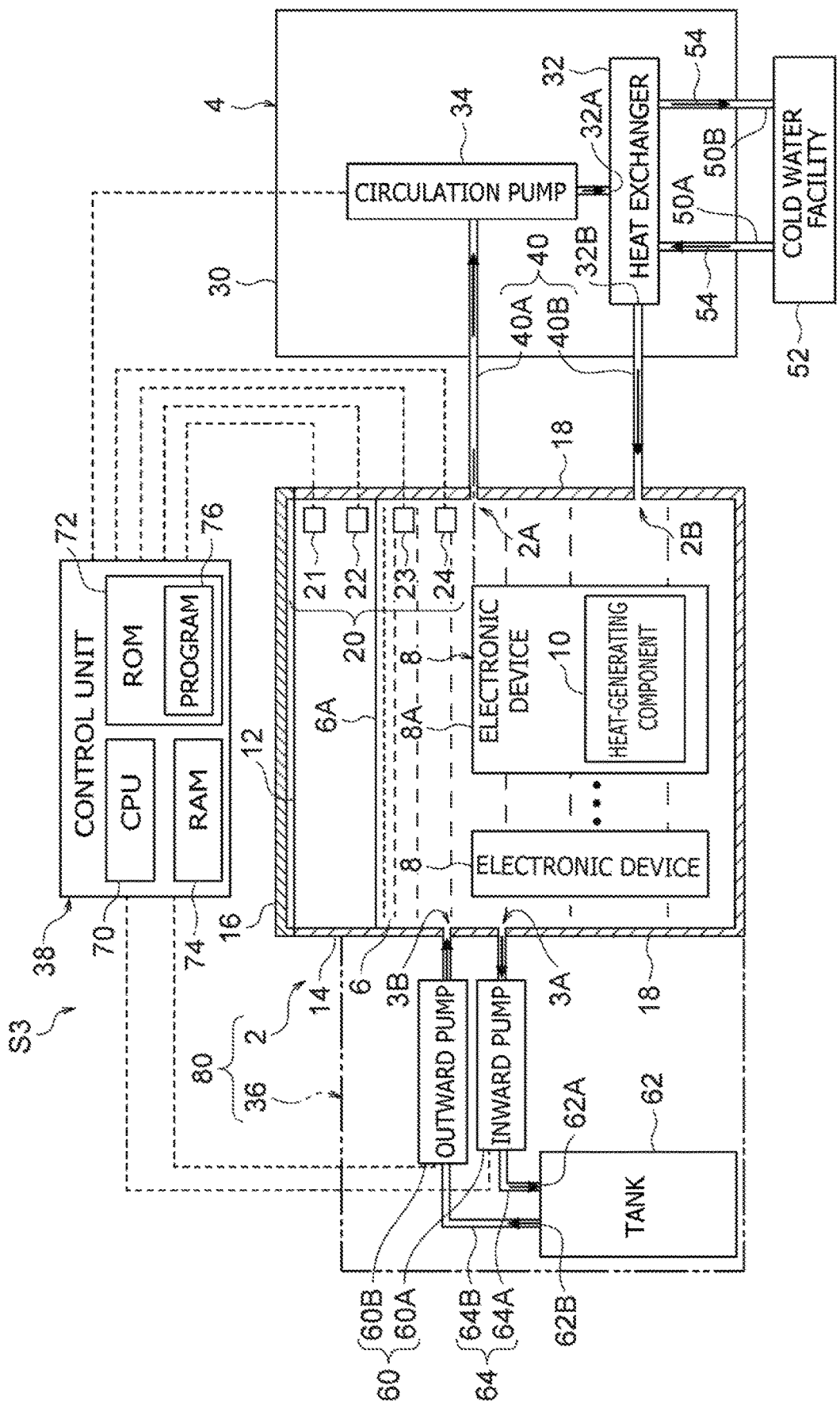
FIG. 5 is a block diagram illustrating a configuration of an immersion system according to a third embodiment.

A configuration of an immersion system S3 according to the third embodiment illustrated in FIG. 5 is changed from the configuration of the immersion system S1 according to the above-described first embodiment as follows.

For example, the immersion system S3 according to the third embodiment includes an immersion tank unit 80 that includes the immersion tank 2, and the liquid level adjustment unit 36 is provided in the immersion tank unit 80. The immersion tank 2 is provided with an outlet 3A and an inlet 3B separately from the discharge port 2A and the supply port 20. The outlet 3A of the immersion tank 2 and the inlet 62A of the tank 62 are coupled to each other through the second outward pipe 64A, and the inlet 3B of the immersion tank 2 and the outlet 62B of the tank 62 are coupled to each other through the second inward pipe 64B.

In the immersion system S3 according to the third embodiment, the program 76 of the control unit 38 is similar to the program 76 of the first embodiment, and the control unit 38 operates similarly to the control unit 38 of the first embodiment.

Thus, even when the volume of the coolant liquid 6 increases or reduces, the liquid level 6A in the immersion tank 2 is adjusted such that the liquid level 6A in the immersion tank 2 is maintained between the levels of the second sensor 22 and the third sensor 23. Accordingly, the liquid level 6A in the immersion tank 2 may be maintained at a position lower than the position of the opening 12 and higher than the position of the electronic device 8. Thus, the likelihood of the liquid level 6A in the immersion tank 2 reaching the opening 12 may be reduced, and accordingly, overflowing of the coolant liquid 6 and spilling of the coolant liquid 6 through the opening 12 may be suppressed. Furthermore, the likelihood of the liquid level 6A in the immersion tank 2 descending to a level lower than the level of the upper end 8A of the electronic device 8 may be reduced, and accordingly, the cooling performance for the electronic device 8 may be ensured.

In the immersion system S3 according to the third embodiment, parts of the configuration similar to parts of the configuration according to the first embodiment perform similar operations and produce similar effects to the operations and effects of the first embodiment. Also in the immersion system S3 according to the third embodiment, modifications similar to the modifications of the first embodiment are able to be employed for the parts of the configuration similar to the parts of the configuration of the first embodiment.

Although the first to third embodiments of the technique disclosed herein have been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An immersion system comprising:
   an immersion tank configured to store a coolant liquid and contain an electronic device;
   a heat exchanger coupled to the immersion tank through first piping;
   a first pump provided in the first piping and configured to circulate the coolant liquid between the immersion tank and the heat exchanger;
   a tank coupled to the immersion tank through second piping;
   a second pump provided in the second piping and configured to move the coolant liquid between the immersion tank and the tank;
   a level sensor provided in the immersion tank and configured to detect a liquid level in the immersion tank; and
   a controller configured to control the second pump in accordance with a detection signal of the level sensor,
   wherein the immersion tank includes
      a container-shaped tank main body that has an opening at an upper end of the tank main body and
      a lid configured to close the opening, and
   wherein the controller controls the second pump in accordance with the detection signal of the level sensor such that the liquid level in the immersion tank is maintained at a position higher than a position of the electronic device and lower than a position of the opening.

2. The immersion system according to claim 1, further comprising:
   a heat exchanger unit that includes the heat exchanger and the first pump,
   wherein the tank and the second pump are provided in the heat exchanger unit.

3. The immersion system according to claim 1,
   wherein the first piping includes
      a first outward pipe coupled to an inlet of the heat exchanger and
      a first inward pipe coupled to an outlet of the heat exchanger,
   wherein the second piping includes
      a second outward pipe coupled to an inlet of the tank and
      a second inward pipe coupled to an outlet of the tank, and
   wherein the second inward pipe is coupled to the first outward pipe.

4. The immersion system according to claim 3, wherein the second outward pipe is coupled to the first outward pipe.

5. The immersion system according to claim 1,
   wherein the level sensor includes
      a first sensor,
      a second sensor,
      a third sensor, and
      a fourth sensor,
   wherein the first sensor, the second sensor, the third sensor, and the fourth sensor are sequentially arranged from an upper side in a height direction of the tank main body,
   wherein the second sensor is disposed at a position lower than the position of the opening,
   wherein the third sensor is disposed at a position higher than the position of the electronic device, and
   wherein the controller controls the second pump in accordance with the detection signal of the level sensor such that the liquid level in the immersion tank is maintained between a level of the second sensor and a level of the third sensor.

6. The immersion system according to claim 5, wherein the first sensor is configured to provide a signal used by the controller to prevent the coolant liquid from reaching the lid.

7. The immersion system according to claim 5, wherein the fourth sensor is configured to provide a signal used by the controller to prevent the coolant liquid from reaching a top of the electronic device.

8. The immersion system according to claim 5,
   wherein the second pump includes
      an outward pump provided in a second outward pipe coupled to an inlet of the tank and
      an inward pump provided in a second inward pipe coupled to an outlet of the tank,
   wherein the controller causes the outward pump to operate when the liquid level in the immersion tank is higher than the level of the second sensor before the first pump and the electronic device operate,
   wherein the controller causes the inward pump to operate when the liquid level in the immersion tank is lower than the level of the third sensor before the first pump unit and the electronic device operate,
   wherein the controller causes the first pump and the electronic device to operate when the liquid level in the immersion tank is lower than the level of the second sensor and higher than the level of the third sensor,
   wherein the controller causes the outward pump to operate when the liquid level in the immersion tank is higher than the level of the second sensor after the first pump and the electronic device have operated, and
   wherein the controller causes the inward pump to operate when the liquid level in the immersion tank is lower than the level of the third sensor after the first pump and the electronic device have operated.

9. The immersion system according to claim 1,
   wherein the immersion tank includes a container-shaped tank main body that has an opening at an upper end of the tank main body and a lid configured to close the opening, and wherein the controller controls the second pump in accordance with the detection signal of the level sensor such that the liquid level in the immersion tank is maintained at a position higher than a position of a heat-generating component mounted in the electronic device and lower than a position of the opening.

10. The immersion system according to claim 9, wherein the level sensor includes a first sensor, a second sensor, a third sensor, and a fourth sensor, wherein the first sensor, the second sensor, the third sensor, and the fourth sensor are sequentially arranged from an upper side in a height direction of the tank main body, wherein the second sensor is disposed at a position lower than the position of the opening, wherein the third sensor is disposed at a position lower than a position of an upper end of the electronic device and higher than the position of the heat-generating component, and wherein the controller controls the second pump in accordance with the detection signal of the level sensor such that the liquid level in the immersion tank is maintained between a level of the second sensor and a level of the third sensor.

11. The immersion system according to claim 10, wherein the first sensor is configured to provide a signal used by the controller to prevent the coolant liquid from reaching the lid.

12. The immersion system according to claim 10, wherein the fourth sensor is configured to provide a signal used by the controller to prevent the coolant liquid from reaching a top of the heat generating component.

13. The immersion system according to claim 10, wherein the second pump includes an outward pump provided in a second outward pipe coupled to an inlet of the tank and an inward pump provided in a second inward pipe coupled to an outlet of the tank, wherein the controller causes the inward pump to operate when the liquid level in the immersion tank is lower than the level of the third sensor before the electronic device operates, wherein the controller causes the electronic device to operate when the liquid level in the immersion tank is higher than the level of the third sensor, wherein the controller causes the first pump to operate when the liquid level in the immersion tank is lower than the level of the second sensor after the electronic device has operated, and wherein the controller causes the outward pump to operate when the liquid level in the immersion tank is higher than the level of the second sensor after the electronic device and the first pump have operated.

14. The immersion system according to claim 1, further comprising:

an immersion tank unit that includes the immersion tank, wherein the tank and the second pump are provided in the immersion tank unit.

15. The immersion system according to claim 1, wherein the tank is coupled to the immersion tank through the second piping and the first piping.

16. The immersion system according to claim 1, wherein a discharge port from the immersion tank to the first piping is arranged at a same level as an upper end of the electronic device.

17. The immersion system according to claim 1, wherein the heat exchanger is coupled to a cold water facility through piping that is separate from the first piping and the second piping.

18. The immersion system according to claim 1, wherein coolant liquid being moved from the tank to the immersion tank travels through the heat exchanger.

19. A system for controlling liquid coolant level within an immersion tank including an electronic device, the system comprising:

a heat exchanger coupled to the immersion tank and configured to cool the liquid coolant provided to the immersion tank;

a first pump configured to circulate the coolant liquid between the immersion tank and the heat exchanger;

a tank configured to store liquid coolant added or removed from the immersion tank in order to control the level of the liquid coolant within the immersion tank;

a second pump provided configured to move the coolant liquid between the immersion tank and the tank;

a level sensor configured to detect the level of the liquid coolant in the immersion tank; and a controller configured to control the second pump in accordance with a detection signal of the level sensor, wherein the immersion tank includes a container-shaped tank main body that has an opening at an upper end of the tank main body and a lid configured to close the opening, and wherein the controller controls the second pump in accordance with the detection signal of the level sensor such that the liquid level in the immersion tank is maintained at a position higher than a position of the electronic device and lower than a position of the opening.

* * * * *